(12) United States Patent
Wong et al.

(10) Patent No.: US 7,679,951 B2
(45) Date of Patent: Mar. 16, 2010

(54) CHARGE MAPPING MEMORY ARRAY FORMED OF MATERIALS WITH MUTABLE ELECTRICAL CHARACTERISTICS

(75) Inventors: William S. Wong, San Carlos, CA (US); Sanjiv Sambandan, Palo Alto, CA (US); Tse Nga Ng, Palo Alto, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/962,976

(22) Filed: Dec. 21, 2007

(65) Prior Publication Data

US 2009/0161409 A1 Jun. 25, 2009

(51) Int. Cl.
*G11C 11/00* (2006.01)
(52) U.S. Cl. ..................... 365/163; 365/149
(58) Field of Classification Search ............. 365/163, 365/149
See application file for complete search history.

(56) References Cited

U.S. PATENT DOCUMENTS

| | | | |
|---|---|---|---|
| 5,488,601 A * | 1/1996 | Sakano et al. | 369/120 |
| 5,742,551 A * | 4/1998 | Yukutake et al. | 365/207 |
| 6,368,984 B1 * | 4/2002 | Tomita et al. | 438/773 |
| 6,501,230 B1 * | 12/2002 | Feldman | 315/169.3 |
| 6,812,509 B2 | 11/2004 | Zu | |
| 7,071,485 B2 * | 7/2006 | Takaura et al. | 257/3 |
| 7,535,756 B2 * | 5/2009 | Lung | 365/163 |
| 2007/0051940 A1 | 3/2007 | Clemens et al. | |

FOREIGN PATENT DOCUMENTS

| | | |
|---|---|---|
| EP | 1 580 762 | 3/2005 |
| EP | 08171727.4 | 3/2009 |
| WO | WO9954936 | 10/1999 |
| WO | WO2005/117025 A1 | 8/2005 |

OTHER PUBLICATIONS

High-Performance Solution-Processed Polymer Ferroelectric Field-Effect Transistors; Naber, Ronald C. G.; Tanase, Christina; Blom, Paul W. M.; Gelinck, Gerwin G. H.; Marsman, Albert W.; Touwslager, Fred J.; Setayesh, Sepas; DeLeeuw, Dago M., Published online Nature Publishing Group: Feb. 20, 2005.
Performance Analysis of a 127-Micron Pixel Large-Area TFT/Photodiode Array With Boosted Fill Factor, Weisfield, Richard L.; Yao, William; Speaker, Tycho; Zhou, Jungang; Colbeth, Richard E.; Prano, Desar, May 2004.

* cited by examiner

*Primary Examiner*—Viet Q Nguyen
(74) *Attorney, Agent, or Firm*—Marger Johnson & McCollom, P.C.

(57) ABSTRACT

A memory cell array including a data line; a capacitor; and a transistor coupled between the data line and the capacitor. At least one of the capacitor and the transistor includes a material with a mutable electrical characteristic.

A memory cell array including a first transistor coupled between a first node, a second node, and a third node; and a second transistor coupled between the second node and a fourth node. The first transistor includes a material with a mutable electrical characteristic.

9 Claims, 4 Drawing Sheets

FIG. 10

CHARGE MAPPING MEMORY ARRAY FORMED OF MATERIALS WITH MUTABLE ELECTRICAL CHARACTERISTICS

BACKGROUND

Typical memory storage devices require complex circuits and high performance materials in order to provide stable and reliable storage of information. Techniques of non-volatile data storage are based on multiple approaches. Some materials such as amorphous silicon exhibit phase change from amorphous to crystalline state when heated to fusing point and cooled slowly. This process is reversible by heating and rapidly cooling the material. The difference between the two states is detected by the change in resistance. The heating rates can be controlled by controlling the current flow through the devices.

In addition, complementary metal-oxide semiconductor (CMOS) flash memories include a buried gate MOS capacitor. During write operation, charge is placed on the capacitor by the application of high electric fields. This charge is read out with simultaneous resetting of the memory. This gate is then capacitively programmed, and the charge is the MOSFET channel is read to obtain the data.

Furthermore, different techniques can be used to fuse a wire. The data storage is binary, depending in whether the wire is open or not.

DETAILED DESCRIPTION

Embodiments will be described with reference to the drawings. Embodiments use a mutable electrical characteristic of a material to store data. A mutable electrical characteristic of a material is any characteristic of the material that both affects electrical characteristics of a device using the material and is capable of being changed. In one example, the material can have an electrical instability. That is if a bias is applied to a device containing the electrically unstable material, the characteristics of the device can change.

The mutable electrical characteristic of the material can cause a device with the material to exhibit poor performance and electrical instability. Accordingly, an organic-based or polymer-based that would otherwise be undesirable due to its instability can be used for data storage.

The mutability of the electrical characteristic includes the persistence of the change in the electrical characteristics. To be mutable, the change in the characteristic must persist for substantially the same operating conditions of a device. In other words, the mutability of the mutable electrical characteristic of the material does not include a characteristic that changes back at substantially the same time as the bias or other stimuli is removed. For example, consider a semiconductor of a transistor. If a gate bias is applied, the conductance between the source and drain can change. Thus, an electrical characteristic of the semiconductor was changed, inducing the change in the conductance of the transistors. However, once the same gate bias is applied again, the conductance of the transistor is substantially the same. In contrast, if the semiconductor had a mutable electrical characteristic that was changed, when the gate bias is applied again, a different conductance would be achieved. That is, the operating characteristics of the transistor changed for the same operating conditions due to the mutability of the electrical characteristics of the material of the semiconductor.

Figure 1:
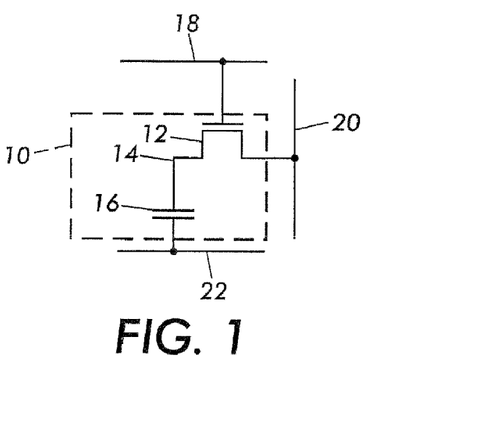
FIG. 1 is a schematic of a memory cell with a material having a mutable electrical characteristic according to an embodiment.

FIG. 1 is a schematic of a memory cell with a material having a mutable electrical characteristic according to an embodiment. The memory cell 10 includes a transistor 12 and a capacitor 16. The transistor 12 and capacitor 16 are coupled through node 14. The transistor 12 is coupled between a conducting data line 20 and the capacitor 16. A conducting gate line 18 is coupled to the gate of the transistor 12. The capacitor 16 is coupled to a conducting reference line 22. At least one of the capacitor and the transistor includes a material with a mutable electrical characteristic. Thus, at least one of the capacitor and the transistor has electrical characteristics that can be changed.

In an embodiment, the transistor 12 is formed of a material with the mutable electrical characteristic. The material can include at least one of a semiconductor material and a dielectric material of the transistor. By changing the mutable electrical characteristic of the material, the electrical characteristics of the transistor 12 can be changed.

Figure 2:
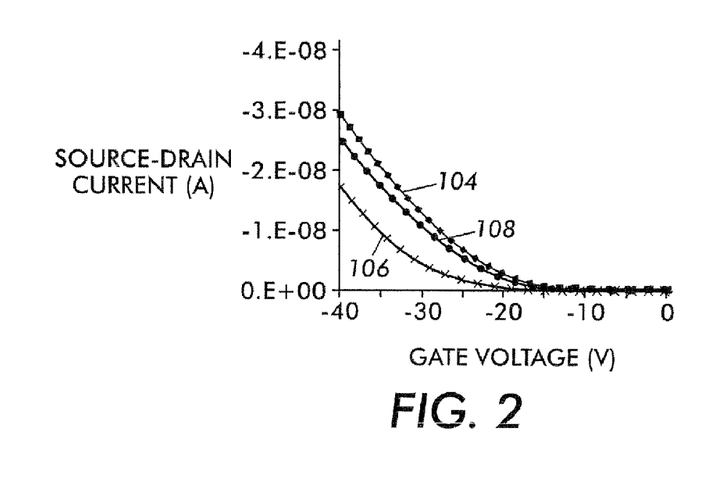
FIG. 2 is a graph of a change in electrical characteristics of a transistor according to an embodiment.

FIG. 2 is a graph of a change in electrical characteristics of a transistor according to an embodiment. The three curves 104, 106, and 108 illustrate an effect of a material with a mutable electrical characteristic on the electrical characteristics of the transistor. Curve 104 illustrates the source-drain current versus gate voltage for initial conditions. Curve 106 illustrates the source-drain current versus gate voltage under similar operating conditions. However, curve 106 represents the electrical characteristic of the transistor after a bias had been applied to the transistor for a period of time. In this example, a gate voltage of −30 V and a source-drain voltage of −10 V were applied for 30 seconds. Due to a change in the material forming the transistor, the electrical characteristics of the transistor have changed. Curve 108 represents the operating characteristic of the transistor after an amount of time has passed.

The amount of time the bias is applied to the transistor can affect the degree of change to the mutable electrical characteristic. Accordingly, to store different data values, differing times, differing biases, or the like can be used to achieve the desired change in the mutable electrical characteristic, Accordingly, by the application of a bias, the current-voltage characteristics of the transistor have changed. The change occurred as a result of a change in the mutable electrical characteristic of the material. Although one particular operating characteristic has been described as being changed, different operating characteristics can be changed. For example, threshold voltage, saturation current, or any other electrical characteristic of the device can be changed.

Although the electrical characteristics of the device may change under other bias conditions, the change described above is the result of a change in the material itself. For example, the above changes on operational characteristics could be caused by a change in the carrier mobility within the semiconductor forming the transistors.

A variety of materials can have a mutable electrical characteristic, such as organic and polymeric materials. For example, the material can include organic semiconductors such as poly(9,9-dioctylfluorene-co-bithiophene) (F8T2), and [6,6]-phenyl C61-butyric acid methyl ester (PCBM). The material can include dielectrics such as silicon dioxide (SiO2), polyvinylalcohol (PVA), polyvinylidene fluoride (PVDF), poly(vinylidene-trifluoroethylene) (P(VDF-TrFE)). The material can be formed by combinations of such materials. For example, semiconductor-dielectric combinations can include F8T2-SiO2, PCBM-PVA, or the like.

Referring back to FIG. 1, in an embodiment, the material with the mutable electrical characteristic can be a dielectric of the capacitor 16. The material can, but need not be the entire dielectric. For example, the material may only be part of the entire dielectric of the capacitor. In such a circumstance, a change in the electrical characteristics of the capacitor 16 can occur. For example, the capacitance of the capacitor 16 can change. In another example, the charge stored on the capacitor 16 for a given voltage can change.

Figure 3:
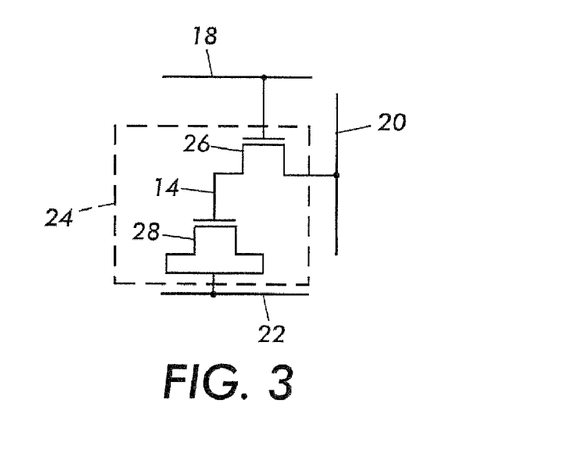
FIG. 3 is a schematic of a memory cell with a material having a mutable electrical characteristic according to another embodiment.

FIG. 3 is a schematic of a memory cell with a material having a mutable electrical characteristic according to another embodiment. The memory cell 24 includes a first transistor 26 and a second transistor 28. The first transistor 26 can be coupled as described in FIG. 1. However, the second transistor 28 can be coupled to form a capacitor coupled to the reference line 22.

Figure 4:
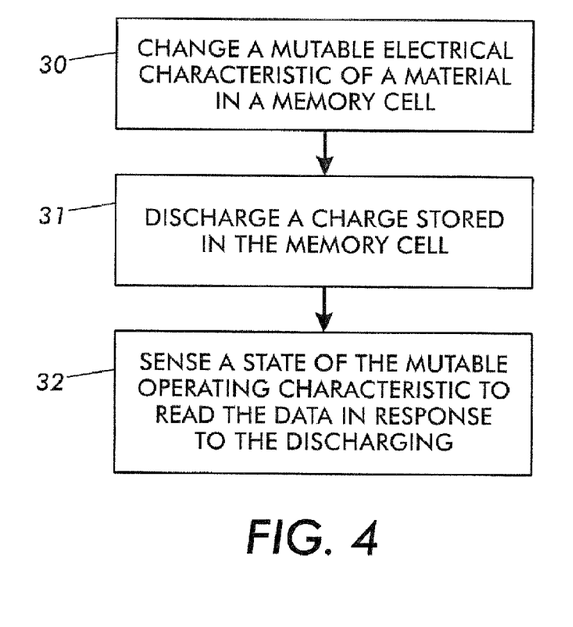
FIG. 4 is a flowchart illustrating accessing data in a memory cell with a material having a mutable electrical characteristic according to an embodiment.

FIG. 4 is a flowchart illustrating accessing data in a memory cell with a material having a mutable electrical characteristic according to an embodiment. In an embodiment, a method of storing data in a memory cell includes changing a mutable electrical characteristic of a material in the memory cell in 30, discharging a charge from the memory cell in 31, and sensing a state of the mutable operating characteristic to read the data in response to the discharging in 32.

As described above, a bias can be applied to a device including the material to induce a change in the mutable electrical characteristic. For example, a gate bias on a transistor can induce a change in the electrical characteristics of the transistor. In another example, a bias can be applied to a capacitor to induce changes in the capacitor. Regardless of what device, the electrical characteristic can be changed in 30.

Figure 5:
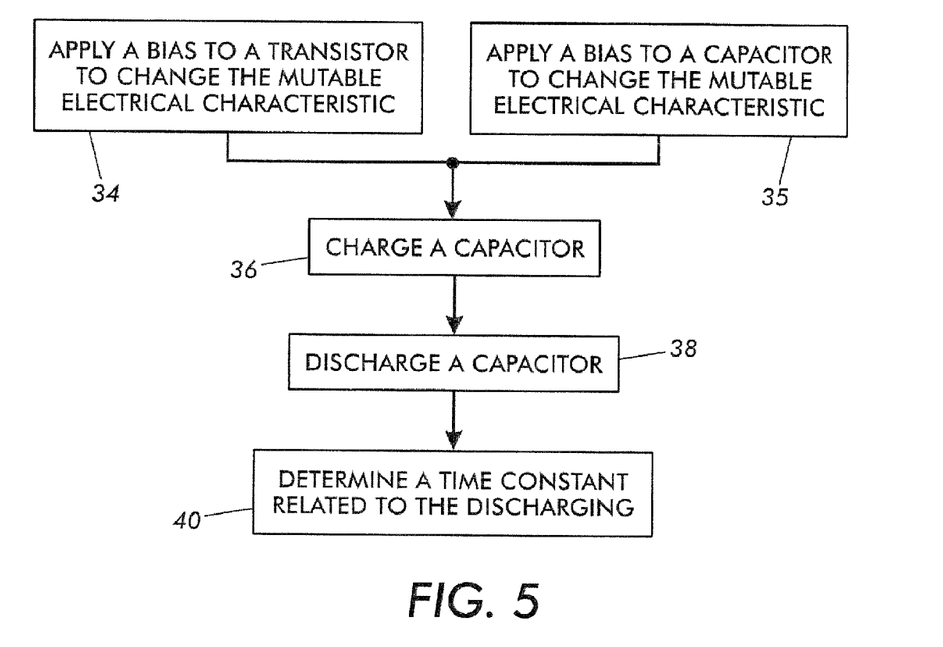
FIG. 5 is a flowchart illustrating an example of writing and reading data in a memory cell with a material having a mutable electrical characteristic according to an embodiment.

FIG. 5 is a flowchart illustrating an example of writing and reading data in a memory cell with a material having a mutable electrical characteristic according to an embodiment. In an embodiment, the material is part of a transistor of the memory cell. In 34, a bias is applied to the transistor to change the mutable operating characteristic. Referring back to FIG. 1 as an example, a bias can be applied to gate line 18 while node 14 is held at another bias by applying a voltage to data line 20. Accordingly, a bias can be introduced across the transistor 12 to change the mutable electrical characteristic.

In another example, the material can be part of the capacitor. The bias can be applied to the capacitor to change its electrical characteristics in 35. For example, referring back to FIG. 1, a bias can be applied to capacitor 16 through the transistor 12. In another example, a bias can be applied to the capacitor 16 by controlling node 14 and the reference line 22. Accordingly, the state of the mutable electrical characteristic of the material of the capacitor 16 can be changed to store data.

Regardless of what device has the material with the mutable electrical characteristic, the state of the mutable electrical characteristic and consequently the data stored in the memory cell can be determined by determining the charge storage and/or charge transfer characteristics of the memory cell. Referring again to FIG. 1 as an example, in 36, the capacitor 16 is charged. This charge can be injected onto the storage capacitor by means of clock feedthrough from the gate switching of transistor 12. In another example, the charge can be supplied through transistor 12.

In 38 the capacitor can be discharged. When the charge is read out, the rate of the charge transfer can be affected by the transistor 12. For example, if the transistor 12 has a higher threshold voltage, the corresponding pixel having a higher discharge time constant as compared to a transistor with lower threshold voltage. This in turn can lead to different levels of charge transfer for a given time period. Accordingly, the time constant can be detected, the amount of charge transferred, the charge storage capacity, or the like can be used in 40 to determine the state of the material in the memory cell and hence the data stored as the change in the material.

In an embodiment, the amount of charge transferred can be measured using a charge sensitive readout amplifier, similar to the technique used in digital x-ray image sensor arrays. As described above, a threshold voltage of a transistor can change to store data. Due to the change in the threshold voltage of the transistor, the charge map will give a spatial image of the stored memory that can then be used, interpreted and converted to useful information.

In an embodiment, the memory cell 10 can be part of a thin film transistor (TFT) array. Node 14 can be a metal layer or contact layer between the transistor device and an external media of a TFT pixel. The TFT pixel can record information based on the mutable electrical characteristic of the materials used to fabricate the TFT device. The TFT array can be a two dimensional pixel array to provide the memory storage locations. Data can be recorded by addressing an individual pixel with a bias voltage. The applied bias results in a charge that is applied at the interface between the semiconductor and dielectric, causing a change in the mutable electrical characteristic of a material in the TFT pixel that affects device performance (e.g. a threshold voltage shift). The information can then be read back out by performing a charge map of the array. TFT pixels with different stored data will have different stored charge readout.

Figure 6:
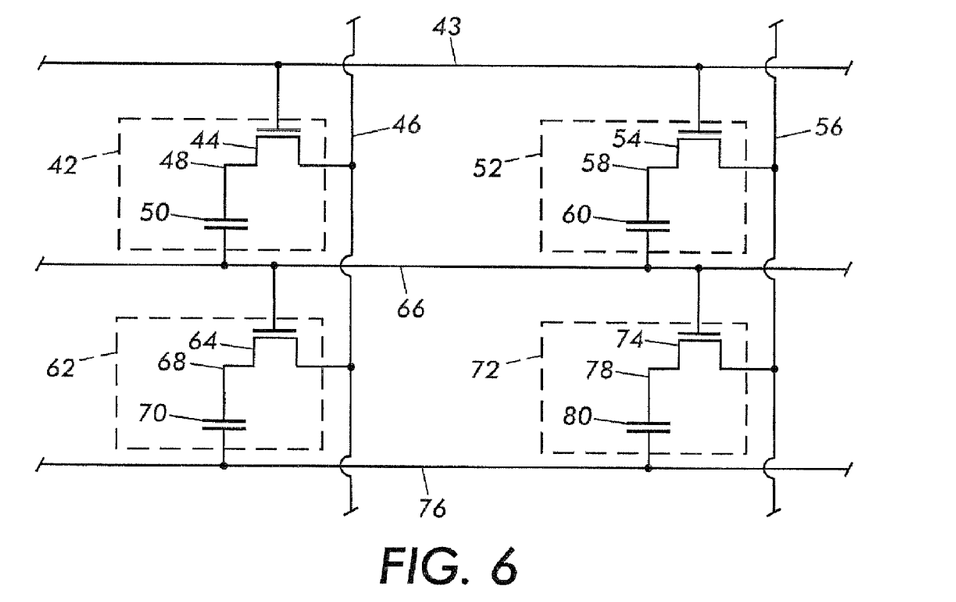
FIG. 6 is a schematic of a memory cell array using the memory cell of FIG. 1 according to an embodiment.

FIG. 6 is a schematic of a memory cell array using the memory cell of FIG. 1. The memory cell array includes four memory cells 42, 52, 62, and 72. Memory cell 42 includes transistor 44 and capacitor 50. Memory cell 52 includes transistor 54 and capacitor 60. Memory cell 62 includes transistor 64 and capacitor 70. Memory cell 72 includes transistor 74 and capacitor 80.

Transistors 44 and 54 are coupled to the same gate line 43. Transistors 64 and 74 are coupled to gate line 66. Capacitors 50 and 60 are coupled to the gate line 66. Capacitors 70 and 80 are coupled to gate line 76. Transistors 44 and 64 are coupled to a data line 46. Transistors 54 and 74 are coupled to a data line 56. Although not illustrated, the ground plate of the capacitors 50, 60, 70, and 80 need not be shared with the corresponding gate select line and can be separate.

Each of the transistor/capacitor pairs of each memory cell is coupled between a data line and a gate line. This particular gate line is not the gate line which is coupled to the transistor. Rather it can be a gate line that is coupled to a gate of a transistor for another memory cell. For example, in memory cell 42, the transistor 44 and capacitor 50 are serially coupled between data line 46 and gate line 66. Note that the gate of transistor 44 is coupled to the gate line 43.

In an embodiment, to write to one of the memory cells, a bias is applied to the transistor of the memory cell. Using memory cell 44 as an example, the gate line 43 is set to a first bias voltage. The node 48 is set to a second bias voltage provided by data line 46. Thus, the bias voltage applied to the transistor 44 is the difference between the first and second bias voltages. At the same time, if desired, to not program other memory cells, nodes such as node 58 of memory cell 52 can be set such that the state of the mutable electrical characteristics of the transistor 54 does not change. For example, node 58 can be set to be substantially equivalent to the voltage of node 43. In another example, node 58 can float. Thus, by controlling the appropriate gate line and the appropriate node, a bias that can change the mutable electrical characteristic can be applied to a selected memory cell. In other words, the gate lines and nodes can act as the row and column select lines of the memory cell. Furthermore, data lines can be controlled during the application of a bias. For example, data line 46 can be controlled to a third bias voltage while programming transistor 44.

The writing operation to program a particular TFT 44 is as follows can consist of two cycles—the preprogramming cycle and the memory cycle. In the preprogramming cycle, all capacitors in pixels of the array are set to ground potential. During the writing cycle, all gate lines are set to ground except for the gate line 43 driving the row of TFT 44. The gate line 43 is set to a potential that ensures the TFT 44 is in conductive state. For example, gate line 43 can be set such that TFT 44 is in a high conductive state. All data lines are set to the same potential as the gate lines except for data line 46 which addresses the pixel with TFT 44. This data line 46 is set to the data to be memorized. This ensures that only TFT 44 experiences a non zero gate to source potential. In this example, for this operation to be successful, the TFT must be a good conductor of current only when the gate-source bias is positive and not a good conductor of current when the gate-source bias is negative, or vice versa.

In an embodiment, the arrays can also have a separate ground line and row select line and thereby providing for another scheme of writing. To change electrical resistance of TFT 44 of a particular pixel, the data line 46 of the column in which the pixel lies is provided the voltage level to be memorized. All other data lines and gate lines of the array are made to float. The gate line 43 driving the TFT to be programmed is now set to a potential permitting the TFT to turn on and conduct, there by allowing the storage capacitor 50 to acquire the potential of 46. All other capacitors and data lines of the same row will acquire the potential of 43 due to capacitive coupling through the TFT terminals. Thus while TFT 44 experiences a gate-source bias which mutates its electrical resistance, all other TFTs do not. After the mutation to electrical resistance is complete, the data line 46 is set to ground, thereby allowing 44 to be set to ground, immediately followed by the gate line 43 being set to ground.

In an embodiment, the TFTs have sufficient overlap capacitance to allow floating terminals to be set to the gate line potential. In another embodiment, the floating terminals can be prevented from floating to very high potentials.

Figure 7:
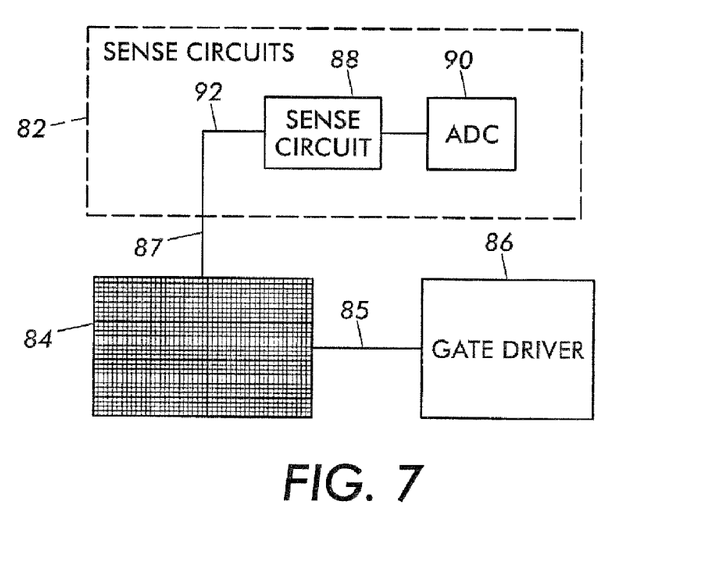
FIG. 7 is a block diagram of a system for reading the memory cell array of FIG. 5 according to an embodiment.

FIG. 7 is a block diagram of a system for reading the memory cell array of FIG. 5 according to an embodiment. A memory cell array 84 is coupled to a gate driver 86 through gate lines 85 and sense circuits 82 through data lines 87. An exemplary sense circuit 88 is illustrated as coupled to data line 92

In an embodiment, data can be read the memory cell array 84. The sense circuit 82 can be tab bonded to the same pad pitch as the data lines 87 on the memory cell array 84. In addition, the gate driver can also be tab bonded to match the row select line pads or gate lines 85 on the memory cell array 84. During a scan, the data lines 87 and row select line pads of the array can be brought in electrical contact with the tabs by pressure contact. The memory cell array 84 can then be scanned row by row by the gate driver 86, while the sense circuit 82 captures the charge on each memory cell. In an embodiment, the output of the sense circuit can be sampled by an analog to digital converter (ADC) 90. However, the output of the sense circuit 88 can already be in a digital format such as a binary signal.

Figure 8:
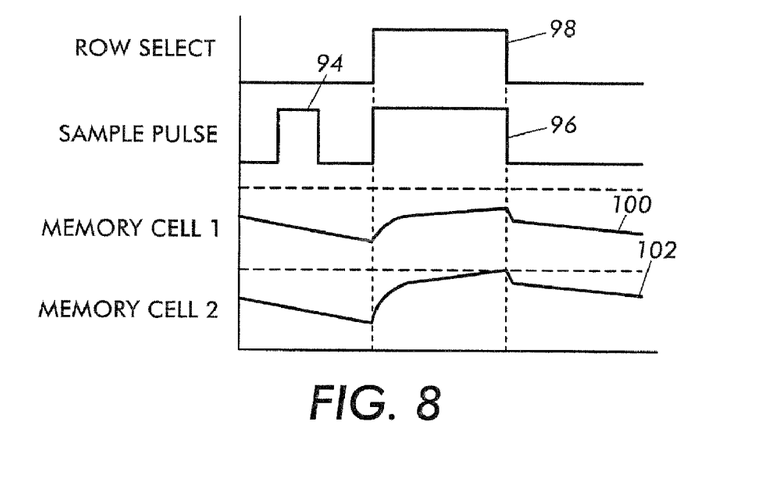
FIG. 8 is a chart of examples of control signals and output signals in a memory cell of FIG. 6.

FIG. 8 is a chart of examples of control signals and output signals in a memory cell of FIG. 1. Signal 98 is a row select signal, such as one that can be applied by the gate driver 86 to select a row of the memory cell array 84. Sample pulses 94 and 96 can control when the sense circuit 88 senses the current from a memory cell. Sense pulse 94 causes the sense circuit 88 to sense the current from a memory cell when the memory cells are not selected with the row select signal 98. Accordingly, a baseline value can be measured.

Sense pulse 96 causes the sense circuit 88 to again sense the current from a memory cell. However, the sense pulse 96 can be substantially coincident with the row select signal 98. Thus, the sense circuit 88 can sense the current flowing through a memory cell. The current sensed in the memory cell can be compared against baseline value. Accordingly, leakage current, offsets, or the like can be removed from the measurement.

Curves 100 and 102 give examples of an output of the sense circuit 88. In this example, the sense circuit 88 can include an integration circuit to integrate the current from a memory cell. Curve 100 represents the integrated value from a memory cell with a mutable electrical characteristic in a first state that causes the current flow to be less than the current flow of a memory cell with a mutable electrical characteristic in a second state as represented by curve 102. For example, referring back to FIG. 6, the transistor 44 of memory cell 42 may have been biased to increase its threshold voltage, causing less current to flow for a given gate bias. Transistor 54 of memory cell 52 may not have been biased as transistor 44, resulting in more current for the same gate bias. Curves 100 and 102 can represent the integrated currents from memory cells 42 and 52 through data lines 46 and 56, respectively.

Another reading scheme could involve first writing charge on the capacitors and then reading the charge/potential on the capacitor separately. Since the RC time constant of the TFT-capacitor has been mutated, different pixels will charge their corresponding storage capacitor with different dynamics. The reading scheme can consist of two operations involving a programming cycle and a readout cycle. In the programming cycle all gate lines are set to a potential keeping the TFTs in conductive state, and all data lines are set to a reference potential. Each capacitor will now try to acquire the reference potential at different rates depending on the RC time constant. If the programming cycle is kept shorter than the expected RC time constant, the charge on the capacitor can be sensed in the readout cycle. The readout cycle can be similar to that described earlier with the exception that the potential on the capacitors can be sensed with the readout electronics.

In an embodiment, more than two states can be stored within a memory cell. For example, a variety of biases can be applied to the transistor 44 to introduce a variety of changes to the mutable electrical characteristic of the material. Accordingly, using the example described above, a variety of currents can be measured from a memory cell. As a result, a memory cell can store more that one bit of data. Thereafter, the data can be retrieved and displayed in any other form e.g. grey levels of color, frequencies of sound etc.

Accordingly, sensing the state of the mutable operating characteristic in 32 as described above can include measuring current passing through the transistor; comparing the current to a reference current passing through the transistor when the mutable operating characteristic is in a first state; and generating the data in response to the comparison.

Although reading a memory cell array has been described in connection with a gate driver 86 and a sense circuit 82, such circuitry can, but need not be part of the memory cell array 84. For example, the gate driver 86 and sense circuitry 82 can be separate from the memory cell array 84. The memory cell array can be formed on a flexible substrate, tape, or the like. The memory cell array 84 can be fabricated using low cost ink jet printing. Accordingly, the memory cell array can be portable, simple to fabricate, and low cost.

Figure 9:
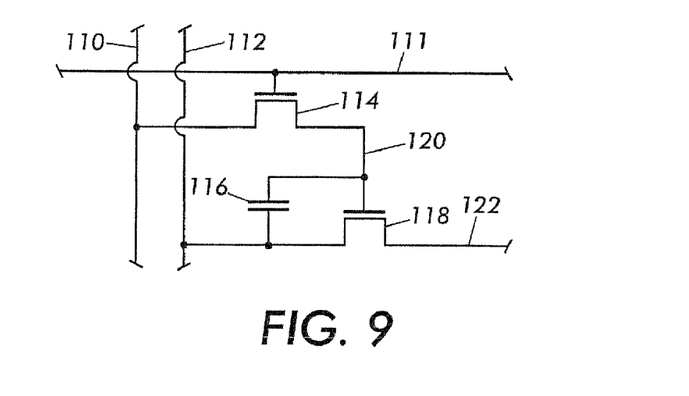
FIG. 9 is a schematic of a memory cell array with a material having a mutable electrical characteristic according to an embodiment.

FIG. 9 is a schematic of a memory cell array with a material having a mutable electrical characteristic according to an embodiment. The memory cell includes a first transistor 118 coupled between a first node 122, a second node 120, and a third node 116; and a second transistor 114 coupled between a fourth node 110 and the second node 120. The first transistor 118 includes a material with a mutable electrical characteristic. The second transistor 114 is provided to allow convenient storage and retrieval of data from the memory cell. Accordingly, other access techniques can be used to access transistor 114. As described above, the material with the mutable electrical characteristic can include at least one of a semiconductor material and a dielectric material of the second transistor.

In an embodiment, a bias can be applied to the first transistor 118 to change the mutable electrical characteristic of the material. The bias can be applied to the fourth node 110 and then applied through the second transistor 114 to the first transistor 118. During application, the third node 112 and/or the first node 122 can be held at voltage to introduce the bias for transistor 118. Accordingly, the state of the mutable electrical characteristic of the material of the first transistor 118 can be changed to store data.

In an embodiment, a capacitor 116 can be coupled between the second node 120 and the third node 112. Thus, if the second node 112 is held at a voltage and the bias is applied through the second transistor 114, the capacitor 116 can be charged up to the level of the bias.

Figure 10:
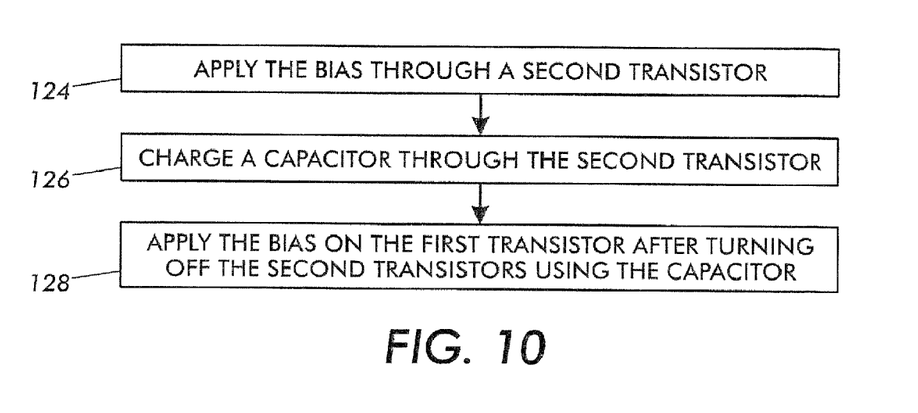
FIG. 10 is a flowchart illustrating writing data to a memory cell of FIG. 8 according to an embodiment.

FIG. 10 is a flowchart illustrating writing data to a memory cell of FIG. 8 according to an embodiment. Referring to FIGS. 9 and 10, in 124, the bias is applied through a second transistor 114. In 126, the capacitor 116 is charged through the second transistor 114. The second transistor 114 can be turned off. In 128, the bias can still be applied to the first transistor 118 using the capacitor after the second transistor 114 is turned off. Accordingly, the bias can, but need not be applied for the entire time through the second transistor 114. The bias can be applied by the capacitor 116 to the transistor 118 for additional time after the second transistor 114 is turned off.

A size of the capacitor 116 can be selected according to a desired hold time of the bias on the first transistor 118. For example, the bias may need to be held at or above a given voltage for a particular period of time. Given the bias initially applied through the second transistor 114 to charge the capacitor 116, and the leakage through the first transistor 118, the leakage through the second transistor 114, or the like, the size of the capacitor 116 can be selected to maintain the desired voltage to bias transistor 118 over the desired time period.

The capacitor 116 can, but need not be distinct from the first transistor 118. That is, the capacitor 116 can be part of the first transistor 118. For example, the gate contact of the first transistor 118 can overlap the source/drain contact that is coupled to the second node 112. Accordingly, more capacitance is created between the gate and source/drain terminals of the first transistor 118. Other layers forming the first transistor 118 can be similarly disposed to increase the capacitance between the desired terminals of the first transistor 118.

In an embodiment, to read the memory cell, a gate bias can be applied to the first node 110. Gate line 111 can be asserted to turn on second transistor 114. Accordingly, the gate bias can be applied to the gate of the first transistor 118 through transistor 114. A bias can be applied to the fourth node 122. As the first transistor 118 is turned on by the gate bias, the first transistor 118 will conduct an amount of current dependent on the state of the mutable electrical characteristic of the material in the first transistor 118. Accordingly, the data can be read by sensing the current through third node 112.

In an embodiment, the above sensing can be repeated with a different gate bias. For example, a gate bias that should turn off the first transistor 118 can be applied through the second transistor 114. The measured current flowing through first transistor 118 can be used as a baseline for determining the amount of current flowing when the previous gate bias was applied. Although the measurement with particular gate biases have been described as occurring in a particular order, the order of the measurements can be in any order as desired.

In an embodiment, the values of the memory cells can be read to create a calibration. For example, with all of the memory cells erased or set to a particular value, these values can be read to create the calibration. For example, the charge transfer rates, current through a transistor, threshold voltage, or the like can all be determined for a baseline. Accordingly, when data is read out at a later time, it can be compared to the calibration. Alternatively, the thresholds for the values read from a memory cell array that divide states of the data can be selected to accommodate leakage currents, process, voltage, and temperature variations, or the like. As a result a calibration can be omitted.

Furthermore, the stored data in the memory cells can be periodically updated. For example, signal decay and threshold voltage shift nonlinearity or the like can cause the stored value to degrade. Accordingly, the stored data can be updated to refresh that data.

In an embodiment, fourth node 110 can be a data input line. A first source/drain terminal of the second transistor 114 can be coupled to the data input line. A second source/drain terminal of the second transistor 114 is coupled to a gate terminal of the first transistor 118. Gate line 111 is coupled to a gate of the second transistor 114. The gate line 111 can be used to control when a bias through the data input line is applied to the first transistor 118. The first transistor 118 can include a first source/drain terminal coupled to node 122 as a bias line. A second source/drain terminal can be coupled to the second node 112 as a data output line.

In an embodiment, the first transistor 118 and the second transistor 114 can be formed from different materials. The first transistor 118 can have a first material and the second transistor 114 can have a second material. A mutability of the mutable electrical characteristic of the first material can be greater than a mutability of the mutable electrical characteristic of the second material. That is, the materials can be selected such that the first transistor 118 can be formed with the more mutable material while the second transistor 114 has a less mutable material. Accordingly, the first transistor 118 can store the data, while the second transistor 114 can operate with less electrical instability under various bias conditions.

An embodiment provides a simple and low-cost approach to fabricating memory storage devices. The materials used are potentially low cost and can be easily integrated onto flexible platforms. The read out procedure for the memory allows for defect tolerant design of the memory device, enabling low-cost printing methods to be used to fabricate the memory devices. In addition, once the data has been read from the array, the memory can be reset to null values and reused as a storage device. However, since the materials and processing used to fabricate the memory device can be low-cost, reuse may not be an issue.

Materials that possess a mutable electrical characteristic while under operation can also change under illumination of light. In an embodiment the memory cell array can be exposed to light. Accordingly, the memory cells can be reset to a known state. Such a process can be used after the readout process so that the recovered memory cell array can then be used again for data storage without the need for recalibration.

An embodiment includes a method of manufacturing a memory cell array. Materials for the memory cell can be deposited by printing. For example, the materials can be deposited by direct printing techniques such as ink-jet printing of all the components and interconnects that make up the electronic devices within an array of pixels. Registration of the different layers that can be accomplished using alignment marks that can be digitally imaged on the printing system. The coordinates of the alignment marks are then used to electronically register subsequent layers.

In an embodiment, multiple materials can be deposited by a print head. For example, the print head can be capable of printing multiple materials such as solution processable semiconductors, dielectrics, and nano-particle metals to fabricate an electronic device. Referring to FIG. 9, all the components of the electronic device can be jet-print fabricated. For example, the fabrication of transistors 114 and 118 would consist of printing a bottom metal layer followed by the dielectric layer and the top metal contact layer to form a field effect-device structure. A first material, such as a semiconductor, can then be printed for transistor 114. A second material, such as a semiconductor, can be printed for transistor 118. The second material can be a material with a mutable electrical characteristic. Both materials can be loaded into the print head for printing. Accordingly, materials for the transistors 114 and 118 can be printed together. The printed materials are first aligned to an alignment mark to identify the position of the printing area. Once alignment is made the printhead passes over the area to be printed and deposits the material in the desired locations.

In an embodiment, the semiconductor materials for transistors 114 and 118 can occupy the same layer in the memory cell array. Because of the capability of printing different materials, elements of transistors in the same layer can be printed with different materials. For example, the fabrication of transistors would consist of printing a bottom metal layer followed by the dielectric layer and the top metal contact layer to form a field effect-device structure. Interconnecting buslines can also be deposited and patterned at the same level as the bottom and top metal layers. Accordingly, when the semiconductor layer for the transistors is deposited, the material for different transistors can be selected as desired. In an embodiment, the semiconductor layer for the transistors can be deposited in a single pass with the print head depositing the appropriate material for a particular transistor as needed.

Although the materials for the transistors have been described as being the materials that are printed, other materials and/or layers can be similarly printed. For example, as described above with reference to FIG. 1, the capacitor can have the material with the mutable electrical characteristic. Accordingly, different materials can be used when printing a layer for the capacitor. For example, the dielectric layer for the capacitor can be printed with the desired material with the mutable electrical characteristic. However, dielectric in the same layer, whether for other capacitors or other components, may not need to have the material with the mutable electrical characteristic. Having a dielectric with the mutable electrical characteristic may even be undesirable in other portions of the memory cell array. Accordingly, a different dielectric material can be selectively printed where the mutable electrical characteristic is not necessary and/or desired. Since the materials can be selectively printed, different materials can be deposited in the same layer for the same or different components. In an embodiment, materials can be chosen such that the read operation does not cause significant changes to the characteristics of either the TFT or the capacitors involved in memory storage.

Although layers for the same types of components have been described as having materials in the same layer, different materials for the same type of components need not be printed in the same layer. For example, the material for transistor 114 can be printed on a first layer. The material for the second transistor 118 can be printed on a second layer. As described above, the different layers can include nanoparticle metals to form a bottom metal layer, followed by the dielectric and the top contact metal, and finally the mutable semiconductor.

In an embodiment, one or more memory cells of the memory cell array can be printed with different characteristics from other memory cells. For example, materials of a memory cell can be eliminated to render the memory cell inoperative. In another example, materials of a memory cell can be selected to make the memory cell unwritable by the expected writing technique. In another example, materials of a memory cell can be selected to set the memory cell to a particular state.

Accordingly, one or more memory cells can be put into a known state at the time of manufacture. In an embodiment, this can be used to encode an identification, signature, or the like on the memory cell array. For example, omission of printed semiconductor in select pixels can be used to encode the memory array. The patterning of the array can already be encoded in an electronic file that can then be used as a reference for specific arrays in a manufacturing process.

Another embodiment includes an article of machine readable code embodied on a machine readable medium that when executed, causes the machine to perform any of the above described operations. As used here, a machine is any device that can execute code. Microprocessors, programmable logic devices, multiprocessor systems, digital signal processors, personal computers, or the like are all examples of such a machine.

Although particular embodiments have been described, it will be appreciated that the principles of the invention are not limited to those embodiments. Variations and modifications may be made without departing from the principles of the invention as set forth in the following claims.

What is claimed is:

1. A memory cell array, comprising:
a data line; and
a component coupled to the data line including a material with a mutable electrical characteristic;
wherein:
the component is a first transistor coupled between a first node, a second node, and a third node;
the third node is the data line; and
further comprising a second transistor coupled between the second node and a fourth node.

2. The memory cell array of claim 1, further comprising:
a capacitor coupled between the second node and the third node.

3. The memory cell array of claim 1, wherein:
the first transistor includes:
a first source/drain terminal coupled to a bias line;
a second source/drain terminal coupled to a data output line; and
a gate terminal;
the second transistor includes:
a first source/drain terminal coupled to a data input line;
a second source/drain terminal coupled to the gate terminal of the first transistor; and
a gate terminal coupled to a gate line; and
the data input line and the data output line are distinct.

4. The memory cell array of claim 1, the material of the first transistor being referred to as a first material, wherein:
the second transistor includes a second material with a mutable electrical characteristic; and
a mutability of the mutable electrical characteristic of the first material is greater than a mutability of the mutable electrical characteristic of the second material.

5. A memory cell array, comprising:
a data line;
a capacitor; and
a transistor coupled between the data line and the capacitor;
wherein one of the capacitor and the transistor is a component coupled to the data line including a material with a mutable electrical characteristic.

6. The memory cell array of claim 5, wherein:
the material with the mutable electrical characteristic includes a dielectric of the capacitor.

7. The memory cell array of claim 5, wherein:
the material with the mutable electrical characteristic includes at least one of a semiconductor material and a dielectric material of the transistor.

8. The memory cell array of claim 7, further comprising:
a first conducting line coupled to a gate of the transistor; and
a second conducting line coupled to the capacitor;
wherein the transistor and the capacitor are serially coupled between the data line and the second conducting line.

9. The memory cell array of claim 5, wherein:
the transistor has a threshold voltage responsive to an amount of time a bias is applied to the transistor.

* * * * *